United States Patent [19]

Dietz

[11] Patent Number: 4,625,155
[45] Date of Patent: Nov. 25, 1986

[54] RESONANT SWITCHING APPARATUS USING A CASCODE ARRANGEMENT

[75] Inventor: Wolfgang F. W. Dietz, New Hope, Pa.

[73] Assignee: RCA Corporation, Princeton, N.J.

[21] Appl. No.: 677,522

[22] Filed: Dec. 3, 1984

[51] Int. Cl.$^4$ ............................................. H01J 29/76
[52] U.S. Cl. ...................................... 315/408; 315/397
[58] Field of Search ........................ 315/408, 396, 397

[56] References Cited

U.S. PATENT DOCUMENTS

| | | | |
|---|---|---|---|
| 3,559,085 | 1/1971 | Ishijima | 315/396 |
| 4,215,295 | 7/1980 | Inoue et al. | 315/397 |
| 4,242,714 | 12/1980 | Yoshida et al. | 315/408 |
| 4,297,621 | 10/1981 | Spilsbury | 315/397 |
| 4,464,612 | 8/1984 | Teuling | 315/408 |
| 4,513,228 | 4/1985 | Teuling | 315/408 |
| 4,556,825 | 12/1985 | Thomas | 315/408 |

OTHER PUBLICATIONS

An application note No. 946 entitled High Voltage, High Frequency Switching Using a Cascode Connection of HEXFET and Bipolar Transistor by S. Clemente, B. Pelly, R. Ruttonsha, B. Taylor published by International Rectifier Co.
An article that appears in Proceedings of Powercon 11 C1-4 submitted for Powercon conference that was held in Apr. 1984, and entitled, Analyzing the Switching Performance of the Emitter-Driven Power Transistor, the author is Tinus van de Wouw.

*Primary Examiner*—Theodore M. Blum
*Assistant Examiner*—David Cain
*Attorney, Agent, or Firm*—Eugene M. Whitacre; Joseph J. Laks; Sammy S. Henig

[57] ABSTRACT

An apparatus for generating a periodic resonant pulse voltage across an inductance includes first and second switches coupled together in a series cascode arrangement. The cascode arrangement applies a first voltage to an inductance for storing energy therein. A periodic switching signal is coupled to the second switch. Each cycle of the switching signal includes a turn-on portion and a turn-off portion. The initiation of the turn-off portion makes the second switch nonconductive to enable the inductance and a resonating capacitance to form a resonant circuit that generates a resonant pulse voltage at a terminal of the resonant circuit. A damper switch is coupled to the inductance for terminating the generation of the resonant pulse voltage at the end of the first interval, prior to the initiation of the turn-on portion of the switching signal. The voltage at the resonant circuit terminal is coupled to the control electrode of the first switch for supplying current thereto during conduction of the damper switch. This enables the first switch to conduct current from the inductance during conduction of the second switch.

19 Claims, 4 Drawing Figures

RESONANT SWITCHING APPARATUS USING A CASCODE ARRANGEMENT

The invention relates to a switch for switching current within a resonant circuit.

A conventionally built output stage of a deflection apparatus, includes, in general, three parallel coupled branches. The first branch includes series coupled deflection winding and a trace capacitor forming a trace resonant circuit during trace. The second branch includes a retrace capacitor that forms with the deflection winding a retrace resonant circuit during retrace. The third branch includes a switch that operates to generate trace and retrace deflection currents in the deflection winding.

When the switch is not conductive, energy is transferred, during the first half of the retrace interval, from the deflection winding into the retrace capacitor; in the second half, it is transferred from the retrace capacitor back to the deflection winding.

Energy is transferred during the first half of the trace interval from the deflection winding into the trace capacitor through a damper diode current path of the switch. In the second half of the trace interval, it is transferred from the trace capacitor back to the deflection winding through a bipolar transistor of the switch.

In accordance with an aspect of the invention, a cascode arrangement switch is used to conduct the trace current during the second half of the trace interval. The cascode arrangement includes a first, bipolar transistor and a second transistor that may be a majority carrier device such as an MOS field effect transistor (FET).

In carrying out the invention, the emitter of the first transistor may, for example, be coupled to a main current terminal of the FET, such as the drain electrode. The trace current flows from the collector of the first transistor, through the drain of the FET and into the source of the FET. A switching control voltage is coupled to the gate of the FET for controlling the switching time of the switch. An attribute of the FET is that it enables fast switching that is difficult to achieve with a bipolar transistor coupled in a common emitter arrangement. This attribute of the FET makes the cascode arrangement switch of the invention particularly desirable for usage in a deflection circuit that operates at a high frequency, such as 64 kilohertz. Also, the very high input impedance of the gate, permits simple drive circuitry.

During retrace, the switch is nonconductive and the high retrace voltage that is developed across the switch, resulting from the interruption in the trace current of the deflection winding caused by the switch becoming nonconductive, is developed across the base-to-collector junction of the first transistor. An attribute of the first transistor is its high breakdown voltage. Thus, using low voltage, fast switching transistor, such as an FET, in the emitter of the high voltage first transistor yields a combined high voltage, high speed cascode arrangement switch.

In accordance with another aspect of the invention, a storage charge is supplied to the base of the first transistor during the first half of trace, when the damper diode of the switch is conductive, but the FET is not. This storage charge turns-on the first transistor. During the second half of trace, when the FET is conductive, the stored charge at the base, that was accumulated during the first half of trace, maintains the first transistor in a conductive state so that the trace current flows from its collector through its emitter to the drain of the turned-on FET. Because the storage charge is injected to the base region prior to turning-on of the FET, the emitter current in the first transistor immediately follows the turn-on instant of the FET to provide high speed, low power switching operation. When the FET is turned off, at the end of trace, the stored charge in the base region of the first transistor is discharged quickly.

It should be understood that using the cascode arrangement switch of the invention is not limited to deflection circuits. It may be used in other applications where current of pulse producing resonating circuits is switched such as in a power supply used for generating a high voltage.

In accordance with an inventive arrangement, apparatus for generating a periodic resonant pulse voltage across an inductance comprises a controllable switching arrangement that includes first and second switching means coupled together in a series cascode arrangement. The cascode arrangement applies a first voltage to an inductance for storing energy therein. A periodic switching signal is coupled to the second switching means. Each cycle of the switching signal includes a turn-on portion and a turn-off portion. The initiation of the turn-off portion makes the second switching means nonconductive to enable the inductance and resonanting capacitance to form a resonant circuit that generates a resonant pulse voltage at a terminal of the resonant circuit during a first interval of the alternating voltage that is developed at that terminal. The controllable switching arrangement provides damper action that terminates the generation of the resonant pulse voltage at the end of the first interval, prior to the initiation of the turn-on portion of the switching signal. A control current is coupled to the control electrode of the first switching means during the occurrence of the damper action to enable the first switching means to conduct current from the inductance during conduction of the second switching means.

Figure 1:
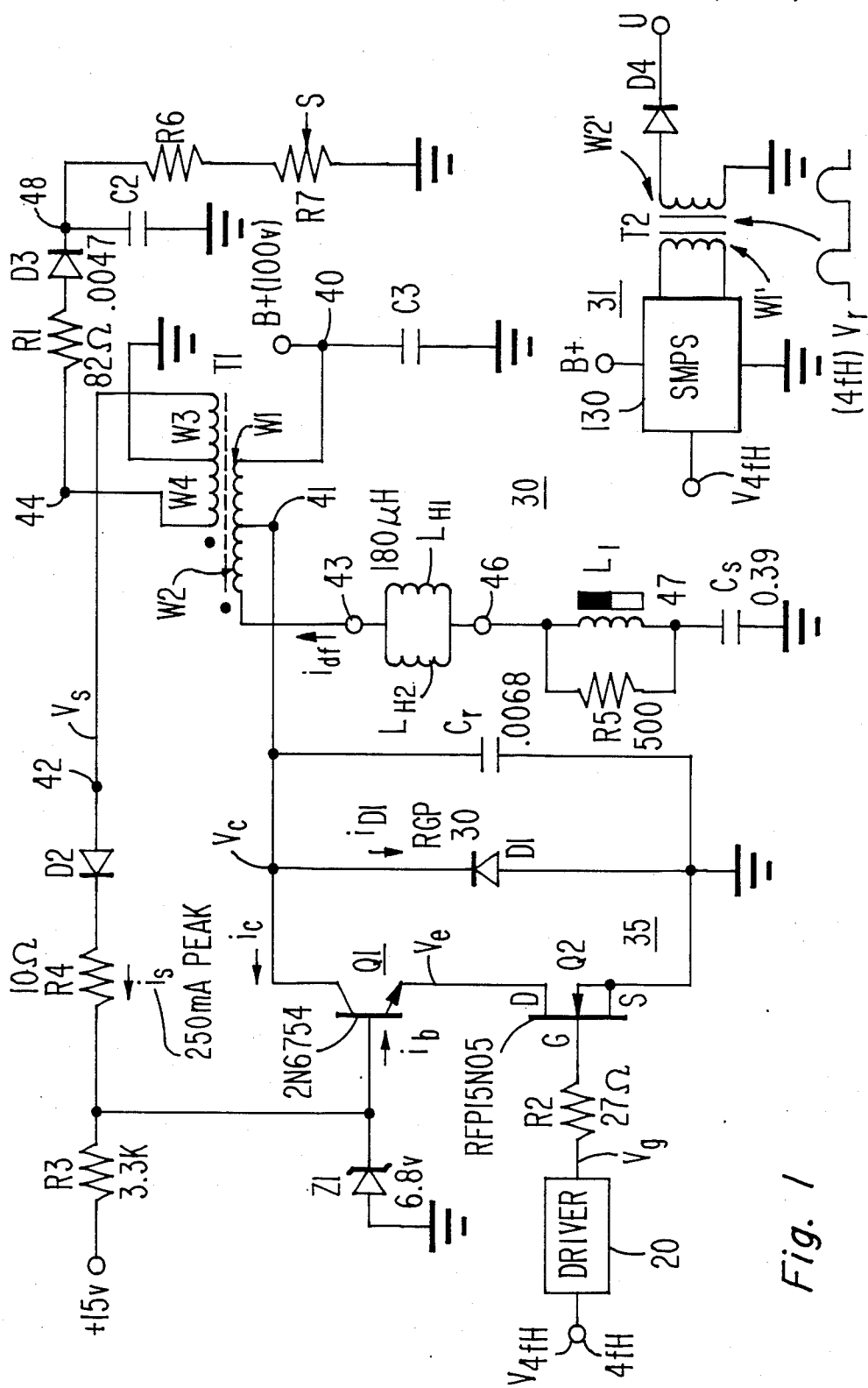
FIG. 1 illustrates a deflection circuit output stage and a high voltage power supply embodying an aspect of the invention.
Figure 2:
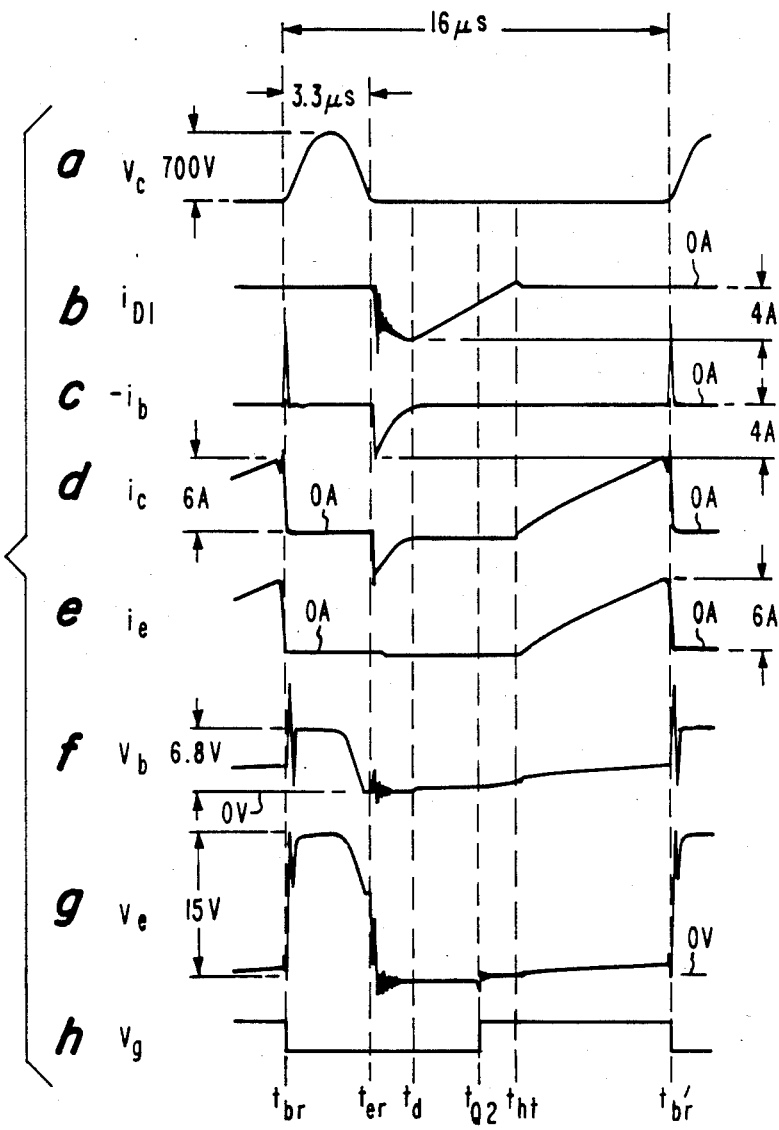
FIGS. 2a-2h illustrate waveforms useful in explaining the operation of the circuit of FIG. 1.

In the arrangement of FIG. 1, a regulated voltage B+, filtered by a capacitor C3, is coupled to an end terminal 40 of a primary winding W1 of a flyback transformer T1. A tap terminal 41, at an intermediate point of winding W1, is coupled to the collector of a transistor Q1 of a switch 35. Each of a damper diode D1 of switch 35, and a retrace capacitor $C_r$ is coupled between terminal 41 and ground, the common conductor.

One end terminal of a parallel arrangement of deflection windings $L_{H1}$ and $L_{H2}$ is coupled to an end terminal 43 of primary winding W1 of transformer T1, forming an autotransformer arrangement. The parallel arrangement of deflection windings $L_{H1}$ and $L_{H2}$ is coupled between terminal 43 and a terminal 46. A parallel arrangement that includes a linearity inductor L1 and a resistor R5 is coupled between terminal 46 and a terminal 47. A trace capacitor $C_S$ is coupled between terminal 47 and ground. Capacitor $C_s$ serves as a source of trace voltage to store energy in the inductance of deflection windings $L_{H1}$ and $L_{H2}$ during the latter portion of conduction by switch 35.

A zener diode Z1 is coupled from the base of transistor Q1 to ground. A terminal 42 of a secondary winding W3 of transformer T1 is also coupled through a diode D2 in series with a current limiting resistor R4 to the base of transistor Q1 for providing a storage charge to the base during the first half of the trace interval, as described later on.

A resistor R3 that supplies a small portion of a base current $i_b$ for transistor Q1 is coupled between a +15 V voltage and the base. Resistor R3 provides base current $i_b$ when deflection circuit 30 is not capable of supplying base current through resistor R4, such as during power-on or start-up.

The emitter of transistor Q1 is coupled to the drain of FET Q2 forming a series cascode switching arrangement.

A horizontal rate voltage $V_{4fH}$, obtained from a timing unit synchronized to the horizontal sync pulses of an incoming composite video signal, not shown in FIG. 1, is coupled through a driver circuit 20 to one end terminal of a resistor R2 to develop a switching signal $V_g$. The other end terminal of resistor R2 is coupled to the gate of FET Q2. The horizontal line deflection frequency is substantially greater than the standard frequency fH=15.75 kilohertz. The line deflection frequency may illustratively be 4fH=64 kilohertz.

A terminal 44 of a secondary winding W4 is coupled through a series arrangement of a resistor R1 and a rectifying diode D3 to a plate 48 of a capacitor C2. The voltage between plate 48 and ground is coupled across a voltage divider that includes resistors R6 and R7 to provide a screen voltage S to a CRT that is not shown in FIG. 1.

FIGS. 2a–2h illustrate waveforms useful in explaining the operation of deflection circuit 30 of FIG. 1. Similar symbols and numerals in FIGS. 1 and 2a–2h indicate similar items or functions.

At time $t_{br}$ of FIGS. 2e and 2h, the beginning of retrace, voltage $V_g$ of FIG. 1, that is coupled to the gate of FET Q2, turns off the current path of current $i_e$ flowing from the drain to the source of FET Q2. As, illustrated in FIGS. 2e and 2d, currents $i_e$ and $i_c$ through the emitter and collector, respectively, of transistor Q1 of FIG. 1 drop fast toward zero immediately after time $t_{br}$. The sweeping out of charge at the base of transistor Q1 by reverse collector current causes breakdown voltage in zener diode Z1, as illustrated in FIG. 2f. Zener diode Z1 remains in breakdown thereafter due to combined effects of current flowing from R3 and the residual reverse collector electrode current. Also, due to reverse breakdown of the base-emitter junction of transistor Q1 of FIG. 1, emitter voltage $V_e$ rises abruptly, as illustrated in FIG. 2g.

Retrace voltage $V_c$ of FIG. 2a is developed across capacitor $C_r$ of FIG. 1 as a result of energy transfer from deflection windings $L_{H1}$ and $L_{H2}$ via retrace current $i_{df}$. Because of the autotransformer arrangement of flyback transformer T1, the retrace voltage at terminal 43 of deflection windings $L_{H1}$ and $L_{H2}$ is higher than voltage $V_c$. On the other hand, current $i_c$ through the collector of transistor Q1 is higher than deflection current $i_{df}$. This is so because of the transformer T1 windings ratio arrangement that provides windings turns ratio of $(N_1-N_2)N_1$, where $N_1$ equals the number of turns between terminals 40 and 43 and $N_2$ equal the number of turns of winding section W2, between tap terminal 41 and terminal 43. This transformer T1 windings ratio arrangement is used for reducing voltage $V_c$ at the collector of transistor Q1 during retrace. This ratio is illustratively 0.64.

At time $t_{er}$, the end of retrace, capacitor $C_r$ voltage $V_c$ of FIG. 2a has completely discharged through deflection windings $L_{H1}$ and $L_{H2}$ and transformer T1 of FIG. 1. Damper diode D1 terminates the generation of the resonant pulse voltage $V_c$ and the generation of the resonant pulse voltage developed at terminal, 43 of the retrace resonant circuit formed by resonant capacitor $C_r$ and the inductance of deflection windings $L_{H1}$ and $L_{H2}$. Deflection current $i_{df}$ in deflection windings $L_{H1}$ and $L_{H2}$, continues to flow through the forward biased diode D1, in the form of current $i_{D1}$ of FIG. 2b, and through forward biased zener diode Z1 that is in series with the base-collector junction of transistor Q1, in the form of base current $i_b$ and reverse collector current $i_c$ of FIGS. 2c and 2d, respectively. Note that the base curent waveform illustrated in FIG. 2c is the negatively referenced current $-i_b$. Thus when positive current flows into the base of Q1, the current waveform of FIG. 2c is below the 0 ampere level.

Zener diode Z1 and transistor Q1 of FIG. 1 assist the slow turn-on type diode D1 in conducting deflection trace current $i_{df}$ until a time $t_d$ of FIG. 2d. From time $t_d$, after diode D1 has fully turned-on, until time $t_{ht}$, diode D1 of FIG. 1 conducts the major part of deflection trace current $i_{D1}$.

Near time $t_{ht}$ of FIGS. 2a–2h, near the center of trace, each of deflection trace current $i_{df}$ of FIG. 1 and current $i_{D1}$ through diode D1 become zero. Current begins to flow to the left from tap terminal 41 of flyback transformer primary winding W1.

In accordance with an aspect of the invention, voltage $V_s$ across secondary winding W3 supplies storage charge to the base of transistor Q1 from, approximately, time $t_{er}$, the beginning of trace, until time $t_{br}'$ of FIG. 2a, at the end of trace. This is so because the trace voltage across primary winding W1, causes an induced voltage $V_s$ in secondary winding W3 to be of a positive polarity at terminal 42. Voltage $V_s$ turns on diode D2 to provide positive current $i_s$ in resistor R4 that sums with the small current in resistor R3 to provide positive base current $i_b$.

Advantageously, the interval in which transistor Q1 is supplied with positive base current overlaps the first half of trace interval $t_{er}$–$t_{ht}$ in which diode D1 is forward biased and prior to conduction of cascode arranged FET Q2. Also, in output stage 30 of the invention, the base storage charge is capable, by itself, to sustain collector current $i_c$ of FIG. 2d between times $t_{ht}$ and $t_{br}'$. This arrangement avoids the use of a bootstrap capacitor between the base of transistor Q1 and ground to provide forward base to emitter conduction that initiates conventional transistor action. The coupling to the base of transistor Q1 of additional capacitance could undesirably cause trace ringing of the deflection current at the beginning of trace, after time $t_{er}$ of FIG. 2, when the base and collector electrodes of Q1 provide a path for damper current.

The amount of current that resistor R4 is required to provide during the trace interval from time $t_{er}$ to time $t_{br}'$ to generate sufficient stored charge in the base region of transistor Q1 is relatively small, less than, for example 250 milliampere, peak. This current is significantly smaller than would otherwise have been required, had the base of bipolar ransistor Q1 been driven normally to provide saturated, forward collector-to-emitter conduction of the deflection current of nearly six amperes peak, for example, at the collector electrode.

Furthermore, the current $i_s$ thru resistor R4 may even decrease towards the end of trace, depending on the magnitude of the trace voltage $V_s$ relative to the base voltage $V_b$. As illustrated in FIGS. 2f and 2g the emitter voltage $V_e$ and thus the base voltage $V_b$ tends to increase from time $t_{ht}$ to time $t'_{br}$ due to increasing voltage drop across the channel resistance of FET Q2 produced by the increasing deflection current $i_{df}$ flowing therethrough.

At the beginning of trace between time $t_{er}$ and time $t_d$, before damper diode D1 becomes fully conductive, the negative deflection current $i_{df}$ flows from ground thru zener iode Z1 into the base electrode and out of the collector electrode, providing an additional mechanism for storing charge in the base region of Q1. After time $t_d$ until time $t_{ht}$, positive base electrode current still flows, obtained from resistors R3 and R4 and from the forward biased zener diode Z1 acting as a conventional diode. This result follows due to the negative voltage being developed at the collector electrode by the forward biased damper diode D1. The positive base current flowing between time $t_d$ and time $t_{ht}$ is relatively small and is not illustrated in FIG. 2c on the current scale used.

The charge stored in the base region of transistor Q2 between times $t_{er}$ and $t_{ht}$ is sufficient by itself to maintain forward collector current $i_c$ of FIG. 2d during the later interval $t_{ht}$ to $t_{br}'$.

During the interval $t_{er}$ to $t_{ht}$, the base-collector PN junction is forward biased, producing a reverse transistor action at the emitter that generates a small negative, emitter to collector current, as illustrated in FIG. 2e between time $t_d$ and time $t_{ht}$. The emitter current flows from ground through the internal, oppositely poled diode, that exists in FET Q2.

At a predetermined time $t_{Q2}$ between time $t_{er}$ and $t_{ht}$ of FIGS. 2a-2h, FET Q2 of FIG. 1 is turned on by gate voltage $V_g$. When deflection trace current $i_{df}$ reverses its polarity, near time $t_{ht}$ of FIGS. 2b and 2d, the stored charge at the base region of transistor Q1, as supplemented slightly by the currents through resistors R4 and R3, causes that current $i_{df}$ of FIG. 1 flow through the collector of transistor Q1 in the form of forward collector current $i_c$ of FIG. 2d. Current $i_c$ also flows through the emitter in the form of forward emitter current $i_e$ of FIG. 2e. Because of the finite channel resistance of FET Q2 of FIG. 1, both voltage $V_e$ of FIG. 2g and voltage $V_b$ of FIG. 2f increase as current $i_e$ of FIG. 2e increases from time $t_{ht}$ to time $t_{br}'$. At time $t_{br}'$, that is equivalent to time $t_{br}$, at the beginning of retrace, FET Q2 of FIG. 1 is turned off, as described before.

In accordance with another feature of the invention, a power supply 31 generates an ultor voltage U by rectifying the voltage at a secondary winding W2' of a high voltage flyback type of transformer T2. Power supply 31 includes a switched mode power supply 130 that is constructed similarly to deflection circuit 30 except that deflection windings $L_{H1}$ and $L_{H2}$ and their branch elements are omitted. Transformer T2 is analogous to flyback transformer T1 of deflection circuit 30. The inductance of transformer T2 then provides substantially the entire inductance that resonates with the resonating capacitance in power supply 130 to generate the narrow pulse voltage $V_r$, repeating at the $4f_H$ rate.

Figure 3:
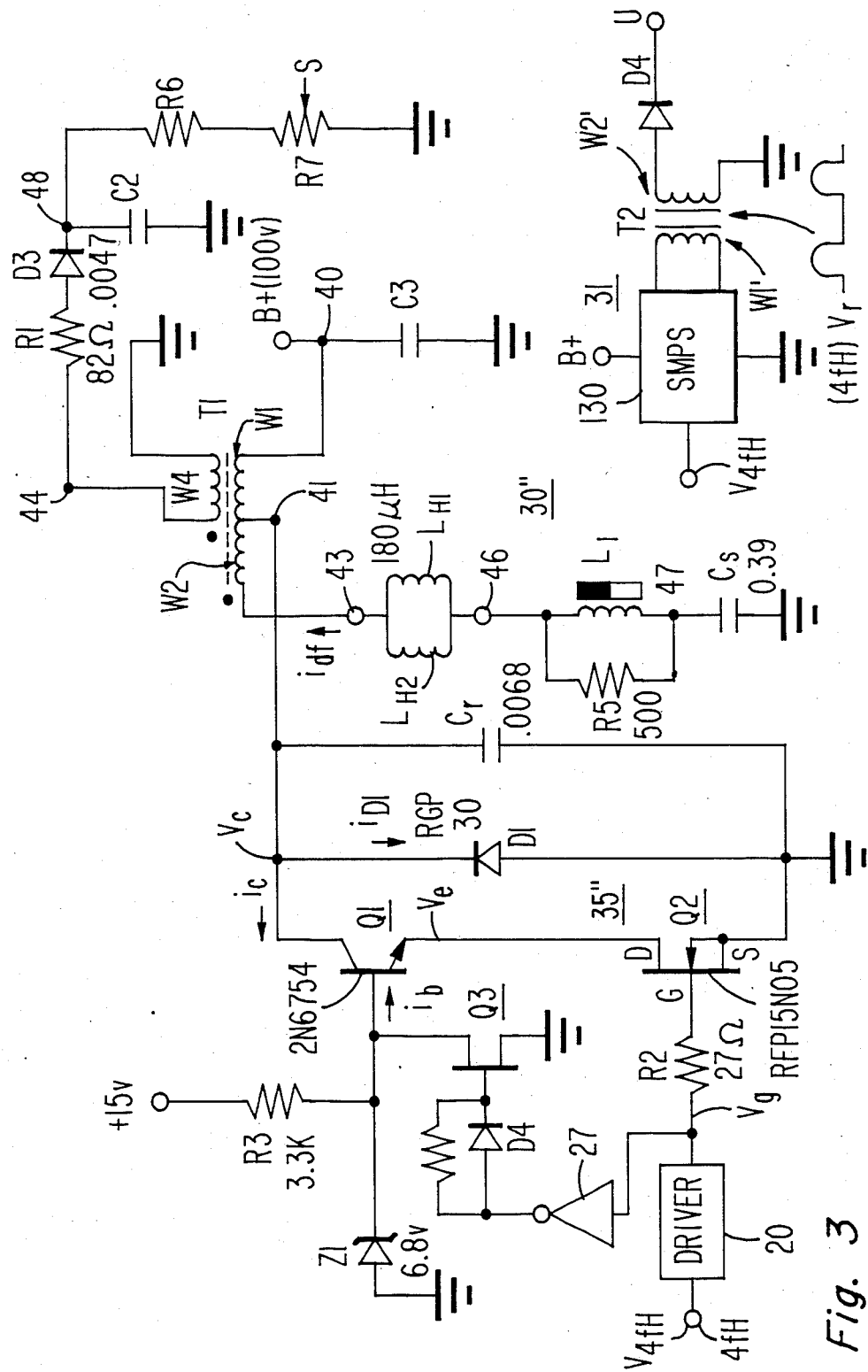
FIG. 3 illustrates a deflection circuit output stage and a high voltage power supply embodying another aspect of the invention.

FIG. 3 illustrates a deflection circuit output stage 30" embodying another aspect of the invention. Similar numbers and symbols in FIGS. 1 and 3 depict similar items or functions. FIGS. 4a-4h illustrate waveforms useful in explaining the operation of output stage 30" of FIG. 3, including a controllable switching arrangement 35" similar to controllable switching arrangement 35 of FIG. 1. FIGS. 4a-4h are analogous to FIGS. 2a-2h, respectively. Similar numbers and symbols in FIGS. 2a-2h and 4a-4h illustrate items or functions. Output stage 30" of FIG. 3, is similar to output stage 30 of FIG. 1 except for the exceptions noted below.

The drain-source channel of a FET Q3 of FIG. 3 is coupled between the base of transistor Q1 and ground. An inverter 27 provides a drive voltage to the gate of FET Q3 that is inverted from voltage $V_g$ supplied to the gate of FET Q2. Thus, FET Q3 of FIG. 3 is conductive when FET Q2 of FIG. 3 is nonconductive, and vice versa.

From time $t_{er}$ of FIGS. 4a-4h, and until time $t_{Q2}$, voltage $V_b$, at the base of transistor Q1 of FIG. 3, is approximately zero because of the low channel resistance of FET Q3 that is turned-on. With FET Q3 turned-on, the voltage across the forward biased base-collector PN junction of transistor Q1 is approximately the same as the voltage across diode D1. Current $-i_b$ or $i_c$ of FIGS. 4c and 4d, respectively, provides a current path for deflection current $i_{df}$ that is in parallel to that through diode D1.

Because the voltage across the forward biased base-collector PN junction of transistor Q1 and across the forward bias PN junction of diode D1 is substantially the same, the switching time of the current through both immediately after time $t_{er}$ of FIGS. 4a-4h is advantageously faster than if damper action is substantially provided by only one PN junction. Thus, power losses in switch 35" of FIG. 3 are lower than if damper action is substantially provided by only one PN junction. The forward biased base-collector PN junction of transistor Q1 causes that additional base charge is stored during the damper action.

Figure 4:
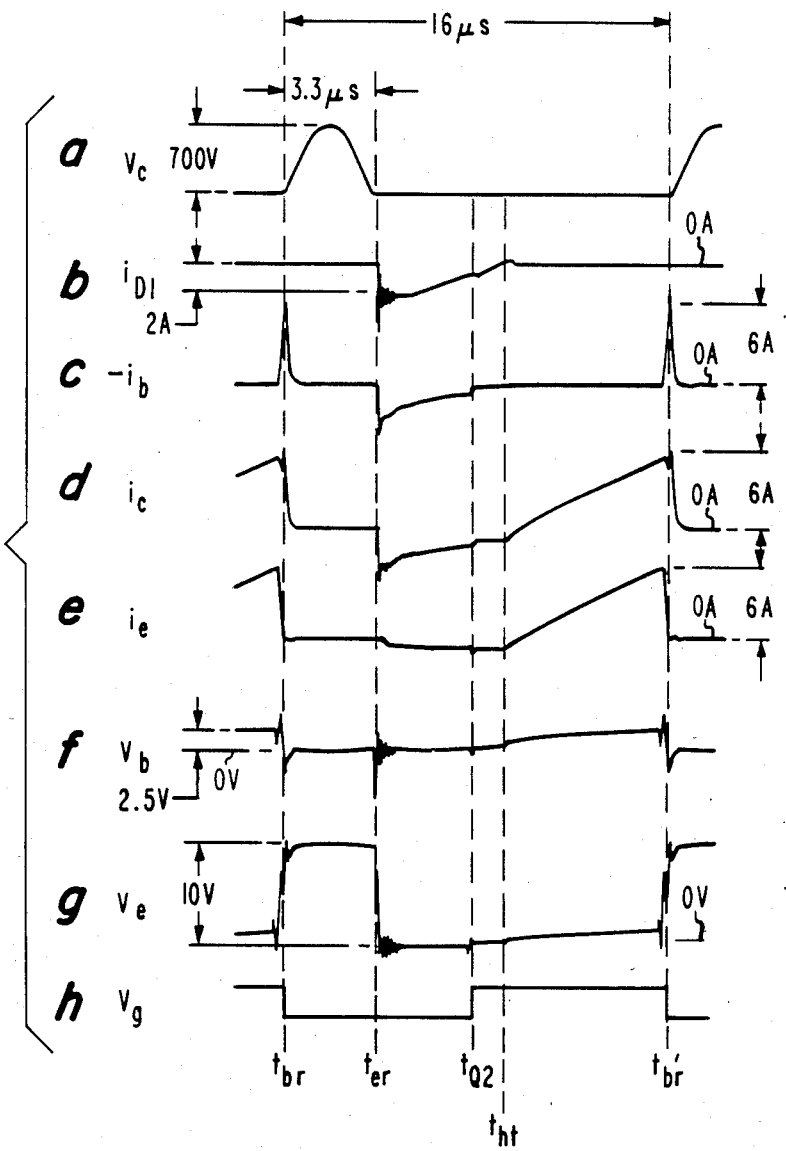
FIGS. 4a-4h illustrate waveforms useful in explaining the operation of the circuit of FIG. 3.

At time $t_{Q2}$ of FIGS. 4a-4h, FET Q3 of FIG. 3 is turned off. When forward collector current commences at time $t_{ht}$, the charge already stored in the base region of transistor Q1 is trapped, since as indicated in FIG. 4c, after time $t_{Q2}$, no significant base electrode current flows in transistor Q1. The base electrode current flowing when forward collector-to-emitter current flows, is insufficient, by itself, to maintain transistor Q1 in a saturated state during the later portion of conduction of FET Q2. However, the stored charge in the base region is capable of sustaining collector current $i_c$ of FIG. 4d after time $t_{ht}$, and of maintaining transistor Q1 of FIG. 3 in a saturated, or closed, without the need for additional positive base current. Advantageously, the arrangement of winding W3, diode D2 and resistor R4, used in deflection circuit 30 of FIG. 1 to provide base current is eliminated from deflection circuit 30" of FIG. 3.

What is claimed:
1. An apparatus for generating a periodic resonant pulse voltage across an inductance, comprising:
an inductance;
a resonating capacitance coupled to said inductance;
a source of first voltage;
a controllable switching arrangement including first and second switching means coupled together in a series cascode arrangement, said cascode arrange- ment applying said first voltage to said inductance for storing energy therein;

a source of a periodic switching signal coupled to said second switching means, each cycle of said switching signal including a turn-on portion and a turn-off portion, the initiation of said turn-off portion making said second switching means nonconductive to enable said inductance and resonating capacitance to form a resonant circuit that generates a resonant pulse voltage at a terminal of said resonant circuit during a first interval of the alternating voltage being developed at said terminal, said controllable switching arrangement providing a damper action that terminates the generation of said resonant pulse voltage at the end of said first interval, prior to the initiation of the turn-on portion of said switching signal; and means responsive to the voltage at said resonant circuit terminal for supplying a control current to a control electrode of said first switching means during the occurrence of said damper action to enable said first switching means to conduct current from said inductance during conduction of said second switching means.

2. An apparatus as recited in claim 1, wherein said control current supplying means comprises a transformer that is coupled to said inductance for supplying said control current from a terminal of said transformer.

3. An apparatus as recited in claim 2, wherein said control current supplying means further comprises a rectifier that couples said terminal of said transformer to said control electrode, for conducting said control current during the occurrence of said damper action.

4. An apparatus as recited in claim 1, wherein said first switching means is in a closed state immediately prior to the initiation of the turn-on portion of said switching signal.

5. An apparatus as recited in claim 1, wherein said first switching means comprises a bipolar transistor that is coupled in said series cascode arrangement to said second switching means.

6. An apparatus as recited in claim 5, wherein said control current supplying means supplies said control current to the base of said bipolar transistor for storing charge in said bipolar transistor prior to the initiation of the turn-on portion of said switching signal.

7. The apparatus as recited in claim 6 wherein the charge that is stored in said bipolar transistor is capable of maintaining said bipolar transistor in a closed state throughout said turned-on portion of said switching signal.

8. An apparatus according to claim 5 wherein the base-collector junction of said transistor is included in said controllable switch, said collector-base junction of said transistor being capable of conducting a portion of the controllable switch current to provide damper action.

9. An apparatus as recited in claim 5 wherein said controllable switch includes a rectifer and a third switching means that couples a PN junction of said transistor to said rectifier such that the voltage across said rectifier and said PN junction is substantially the same and wherein each of said PN junction and rectifier is conductive to provide said damper action.

10. An apparatus as recited in claim 5 wherein said control current supplying means includes a third switching means that is coupled to the base electrode of said bipolar transistor and that conducts said control current from said inductance to the base electrode of said bipolar transistor.

11. An apparatus as recited in claim 1 further comprising a resistor for coupling a second voltage to said control electrode of said first switching means that supplies a voltage thereto to start-up the operation of said apparatus.

12. An apparatus as recited in claim 1, wherein said second switching means comprises a field effect transistor.

13. An apparatus for generating a periodic resonant pulse voltage across an inductance, comprising:
an inductance;
a resonating capacitance coupled to said inductance;
a source of first voltage;
first and second switching means coupled together in a series cascode arrangement, said cascode arrangement applying said first voltage to said inductance for storing energy therein;
a source of a periodic switching signal coupled to said second switching means, each cycle of said switching signal including a turn-on portion and a turn-off portion, the initiation of said turn-off portion making said second switching means nonconductive to enable said inductance and resonating capacitance to form a resonant circuit that generates a resonant pulse voltage at a terminal of said resonant circuit during a first interval of the alternating voltage being developed at said terminal;
a damper switch coupled to said inductance for terminating the generation of said resonant pulse voltage at the end of said first interval, prior to the initiation of the turn-on portion of said switching signal; and
means coupled to the control electrode of said first switching means for storing charge during the time in which said damper switch is conductive, wherein the charge stored by said charge storing means during the time in which said damper switch is conductive enables said first switching means to conduct current from said inductance during conduction of said second switching means.

14. An apparatus according to claim 13 wherein said first switching means comprises a transistor that is coupled in said series cascode and wherein the charge that is stored by said storing charge means is stored in said transistor during the time in which said damper switch is conductive.

15. Apparatus according to claim 14 wherein the base electrode current flowing in said transistor, when forward collector-to-emitter current flows, is insufficient to maintain said transistor in a saturated state during the later portion of conduction of said second switching means.

16. An apparatus as recited in claim 13, wherein said second switching means comprises a field effect transistor.

17. An apparatus for generating a deflection current in a deflection winding comprising:
a deflection winding;
a retrace capacitance coupled to said deflection winding;
a controllable switching arrangement including a first bipolar switch and a second field effect transistor switch coupled together in a series cascode arrangement, said controllable switching arrangement when closed generating the trace deflection current;
a source of a periodic switching signal coupled to said field effect transistor switch, each cycle of said switching signal including a turn-on portion and a turn-off portion, the initiation of said turn-off portion making said field effect transistor switch nonconductive to enable said deflection winding and retrace capacitance to form a resonant circuit that generates a resonant pulse voltage at a terminal of said resonant circuit during a retrace interval, said controllable switching arrangement providing damper action that terminates said retrace interval; and means coupled to the base electrode of said bipolar switch for providing base current thereto during the occurrence of said damper action to enable said bipolar switch to conduct said deflection current as forward collector current during the latter portion of trace.

18. An apparatus as recited in claim 17 wherein said base current providing means comprises a transformer that is coupled to said deflection winding for supplying said base current thereto, wherein said controllable switch further comprises a damper diode that conducts during said turn-off portion of said switching signal and wherein a zener diode is coupled to the base electrode of said bipolar switch.

19. An apparatus as recited in claim 17 wherein said controllable switch includes a damper diode that provides the damper action, and wherein said apparatus further comprises, a third switch that is coupled to the base electrode of said first bipolar switch for providing said base current thereto, and a zener diode that is coupled to the base electrode of said first bipolar switch.

* * * * *